(12) United States Patent
Dalton et al.

(10) Patent No.: US 6,815,813 B1
(45) Date of Patent: Nov. 9, 2004

(54) SELF-CONTAINED HEAT SINK AND A METHOD FOR FABRICATING SAME

(75) Inventors: Timothy J. Dalton, Ridgefield, CT (US); Kevin S. Petrarca, Newburgh, NY (US); Michelle L. Steen, Danbury, CT (US); Cornelia K. Tsang, Mohegan Lake, NY (US); Richard P. Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,211

(22) Filed: Jul. 1, 2003

(51) Int. Cl.[7] .............................................. H01L 23/34
(52) U.S. Cl. ...................... 257/706; 257/719; 257/720; 361/296; 361/701; 361/709; 361/817
(58) Field of Search ................................ 257/706, 719, 257/720, 730, 796; 361/639, 701, 709, 817; 29/890.045, 890.032

(56) References Cited

U.S. PATENT DOCUMENTS

| | | | | |
|---|---|---|---|---|
| 4,033,027 A | * | 7/1977 | Fair et al. ..................... | 438/465 |
| 4,217,689 A | * | 8/1980 | Fujii et al. ................... | 438/465 |
| 4,237,601 A | * | 12/1980 | Woolhouse et al. ........... | 438/33 |
| 4,355,457 A | * | 10/1982 | Barlett et al. ................ | 438/460 |
| 4,624,896 A | * | 11/1986 | Watanabe et al. ........... | 428/428 |
| 5,819,402 A | | 10/1998 | Edwards et al. | |
| 6,271,578 B1 | | 8/2001 | Mitwalsky et al. | |
| 6,380,620 B1 | * | 4/2002 | Suminoe et al. ............ | 257/706 |
| 6,383,893 B1 | | 5/2002 | Begle et al. | |
| 6,552,266 B2 | * | 4/2003 | Carden et al. .............. | 174/52.4 |

FOREIGN PATENT DOCUMENTS

| JP | 59-96757 | * | 6/1984 | .................. 257/669 |
|---|---|---|---|---|

* cited by examiner

*Primary Examiner*—Jasmine Clark
(74) *Attorney, Agent, or Firm*—Lisa U. Jaklitsch; Cantor Colburn LLP

(57) ABSTRACT

A system and method are provided for thermal dissipation from a heat producing electronic device. The system includes a substrate for fabricating integrated circuits, the substrate having a first face and a second face. The second face is disposed substantially parallel to the first face having an electronic device disposed therein. A metallized crack stop is disposed in the first face surrounding the electronic device. A plurality of first metal conduits extend through the substrate from the second face thereof to the crack stop, wherein each first metal conduit is in thermal contact with the crack stop to provide a thermal drain from the electronic device to the second face.

13 Claims, 6 Drawing Sheets

US 6,815,813 B1

SELF-CONTAINED HEAT SINK AND A METHOD FOR FABRICATING SAME

BACKGROUND OF INVENTION

The present invention relates generally to a heat sink and more particularly to a self-contained heat sink and a method for fabricating the same.

As an electronic component operates, the electron flow within the component generates heat. If this heat is not removed, or dissipated, the electronic component may not operate correctly and may become damaged. Typically, the heat generated by the electronic component is dissipated by a cooling means, such as an aluminum (Al) or copper (Cu) heat sink which absorbs and dissipates the heat via direct air convection. Heat sinks are well known in the electronics industry and are used extensively to dissipate heat generated by electronic components used in computers and various other electronic equipment.

However, improvements in integrated circuit (IC) design and fabrication techniques are allowing IC manufacturers to produce smaller IC devices and other electronic components which operate at increasingly faster speeds and which perform an increasingly higher number of operations. As the operating speed and operational parameters of an electronic component increases, so to does the heat generated by these components. As a result, aluminum (Al) or copper (Cu) heat sinks that use conventional direct air cooling technology, or direct air convection, to dissipate heat are fast approaching the limits of their cooling abilities and it is becoming increasingly difficult to dissipate this increased heat. This is true even for electronic components that were once considered to be a low power technology and as such low heat generators, such as complementary metal oxide semiconductor, or CMOS, circuitry.

SUMMARY OF INVENTION

In an exemplary embodiment, a system is provided for thermal dissipation from a heat producing electronic device. The system includes a substrate for fabricating integrated circuits, the substrate having a first face and a second face. The second face is disposed substantially parallel to the first face having an electronic device disposed therein. A metallized crack stop is disposed in the first face surrounding the electronic device. A plurality of first metal conduits extend through the substrate from the second face thereof to the crack stop, wherein each first metal conduit is in thermal contact with the crack stop to provide a thermal drain from the electronic device to the second face.

In an alternative embodiment, a method for thermal dissipation from a heat producing electronic device is disclosed. The method includes configuring a substrate having a first face and a second face, the second face being disposed substantially parallel to the first face. An electronic device is disposed in said first face while a continuous crack stop is etched in the first face surrounding the electronic device and then metallized. A plurality of first metal conduits extend through the substrate from the second face thereof to the crack stop, wherein each first metal conduit is in thermal contact with the crack stop providing a thermal drain from the electronic device to the second face.

DETAILED DESCRIPTION

High power semiconductor devices generate a large amount of heat during operation that must be removed to maintain device performance and to prevent damage. This disclosure describes a self-contained heat sink and a method for fabrication that provides thermal transfer through a front end of the line (FEOL) side of the semiconductor device, the heat producing part of the entire semiconductor product.

Figure 1:
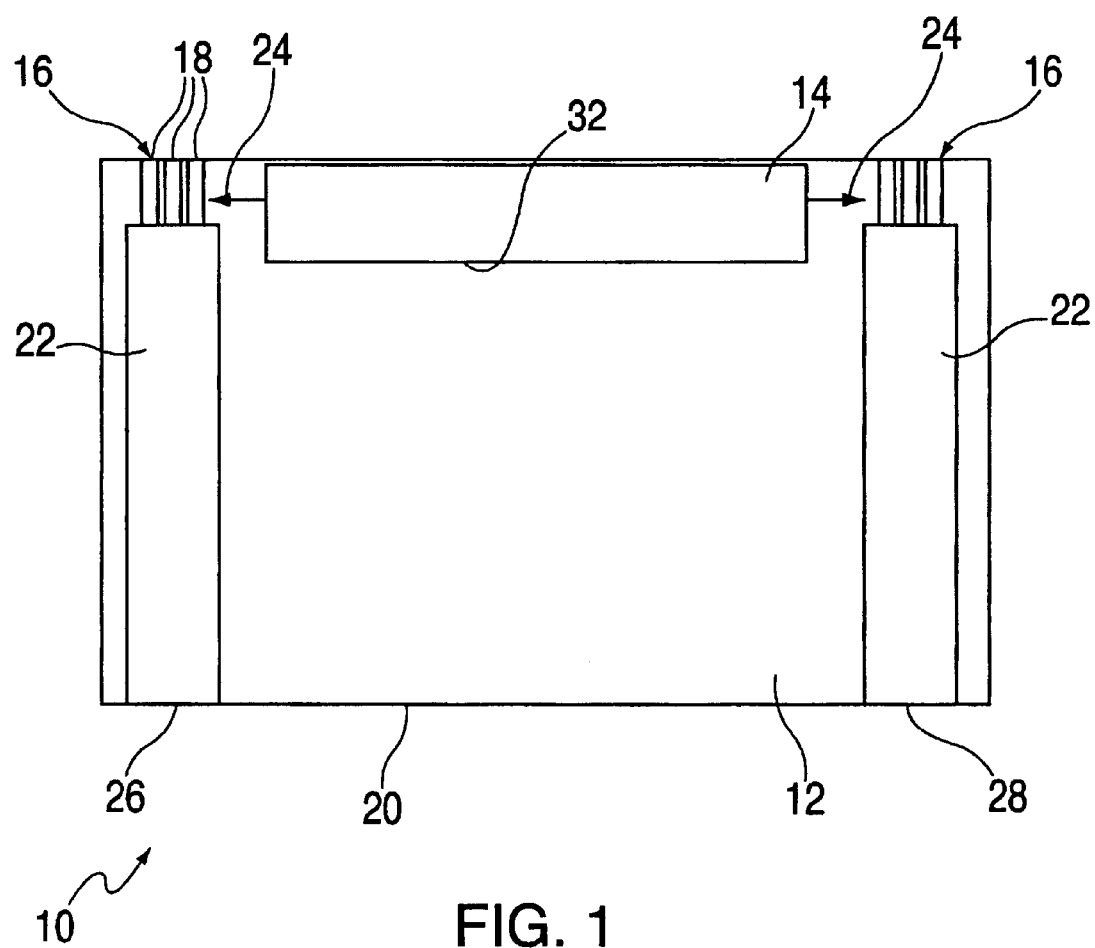
FIG. 1 is a cross section side elevational view of a semiconductor device illustrating a continuous metallized crack stop in thermal contact with two outboard metallized vias extending to a backside of the device.

In one embodiment illustrated in FIG. 1, a semiconductor device generally at 10 includes a semiconductor substrate 12 having an electronic device 14 disposed therewith. Substrate 12 as illustrated, for example, is a single Si chip fabricated from a wafer upon which many such chips are processed in parallel and separated into individual chips. The process of separating the wafer into individual chips is referred to as "dicing." Although a Si substrate is described, it is not limited to Si, as other semiconductor materials may be employed. Electronic device 14 is a solid state integrated circuit device with interconnects, such as a, CMOS logic, analog or mixed signal bipolar, or BiCMOS, for example, but is not limited thereto.

A crack stop 16 is disposed around device 14. In an exemplary embodiment crack stop 16 is continuous and metallized. As illustrated in FIG. 1, crack stop 16 includes three channels 18 extending into wafer 12 toward a backside 20 of the device 10.

As a dicing tool cuts or scribes a wafer, cracks and chips result. Due to the properties of the typical dielectric layer, cracks propagate from the area where the dicing tool cuts the wafer. Cracks in excess of a few microns in depth and several tenths of millimeters in length have been observed. In some instances, such cracks can extend from the cutting edge into the active chip areas, causing significant reliability degradation in the resulting integrated circuits (ICs). This decreases the yield of ICs per wafer.

Discontinuities in the thickness of the dielectric layer are created in the perimeter of the dicing channel near the edges of the ICs. The discontinuities decrease the thickness of the dielectric layer. It has been observed, however, that virtually any discontinuity in thickness within the dielectric layer reduces or stops the cracks from propagating further. Illustratively, three rows of discontinuities, i.e., channels 18 are created near the edges of the ICs. Illustratively, the three rows are substantially parallel to each other in order to conserve surface area of the wafer.

The discontinuities are useful when employed with conventional crack stop techniques to enhance or augment their crack stop efficiency. Conventional crack stop techniques include, for example, complete removal of the dielectric layer or layers. Such techniques are described in U.S. Pat. No. 4,610,079 to Abe et al., which is herein incorporated by reference for all purposes. The discontinuities are also useful when employed as the primary crack stop (i.e., in substitution of conventional crack stop techniques) as a more efficient technique for inhibiting the propagation of cracks into the active regions of the ICs.

In one embodiment, the discontinuities are created by forming channels 18 in the substrate prior to covering the substrate with the dielectric layer. The surface steps are formed using conventional lithographic and etching techniques. Conventional etching techniques include, for example, wet chemical etch and reactive ion etch (RIE). Such techniques are described in, for example, Runyan et al., Semiconductor Integrated Circuit Processing Technology, Addison-Wesley (1990), which is herein incorporated by reference for all purposes.

The channels 18 that create discontinuities in the thickness of the dielectric layer are formed, for example, during existing back-end-of-line (BEOL) processes for fabricating ICs and memory devices.

A plurality of metallized pillars or vias 22 are disposed in thermal contact with crack stop 16 to remove heat from a periphery of the device 14 generally shown with arrows 24. The through-metal vias 22 are formed using a deep silicon etch from backside 20, well known in the art. After etching, metallization of each via 22 is with copper, preferably using Damascene processing, providing a thermal conduit. Although copper is preferred, such other materials include, but are not limited to, aluminum, tungsten, metal pastes, carbon, carbon composites, and similar materials that exhibit a high thermal conductivity along an axis defining via 22.

During the process of metallization or filling of each via 22 with copper, the end and sidewalls defining a length of each copper via 22 are preferably protected from the environment and to prevent migration of the metal into the substrate. The entire via is coated inside with a TaN and Ta layer or other suitable barrier material covers each via 22 in contact with the Si between each adjacent channel 18 and each channel 18 defining crack stop 16. The other end 26 includes a metal passivation layer 28 such as Ni or other suitable self-passivation material that provides suitable thermal conduction of the heat indicated with arrows 24 to crack stop 16 and then through a corresponding metallized via 22 by the TaN or Ta interface therebetween.

Figure 2:
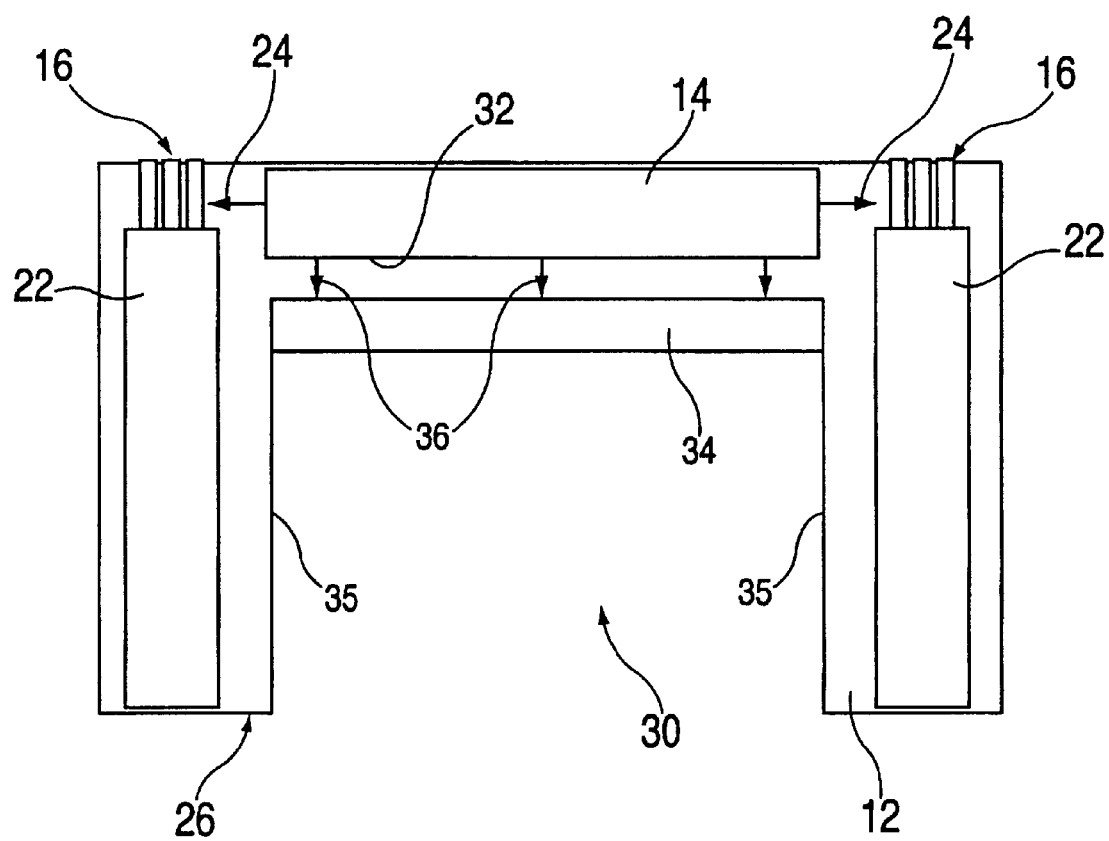
FIG. 2 is a cross section side elevational view of the semiconductor device of FIG. 1 having a planar heat sink disposed proximate an FEOL side of the semiconductor device.

In an alternative embodiment referring now to FIG. 2, the device 10 of FIG. 1 illustrates substrate 12 having a portion removed from a backside thereof. More specifically, a portion of substrate 12 is removed from backside 20 forming a cavity generally shown at 30.

Cavity 30 is formed by bulk removal of silicon by dry etch methods from the backside 20 of substrate 12 aligned with device 14. However, it will be appreciated that the cavity 30 formed does not extend to an FEOL side 32 of device 14.

A bulk conductor 34 is at least disposed substantially parallel and proximate to the FEOL side 32 of device 14. In one embodiment for example, conductor 34 is substantially a planar plate or planar heat sink configured to conduct heat from FEOL side 32 of device 14 indicated generally with arrows 36. Conductor 34 is configured to dissipate the heat generated from device 14. Heat is transferred from the FEOL side 32 of the semiconductor device 14 to bulk conductor 34 located in close proximity to the FEOL side 32 of the semiconductor device 14.

In an exemplary embodiment, bulk conductor 34 is formed by bulk Si removal and subsequent copper metallization. Hence, bulk conductor 34 serves as a large heat sink for efficient heat transfer from all portions of the device, including the interior.

Furthermore, although not illustrated per se, it will be recognized by one skilled in the pertinent art that it is contemplated that sidewalls 35 defining cavity 30 may also include bulk conductor 34 extending down each respective sidewall 35 substantially perpendicular to a portion of bulk conductor 34 disposed substantially parallel and proximate to the FEOL side 32 of device 14 discussed above.

Figure 4:
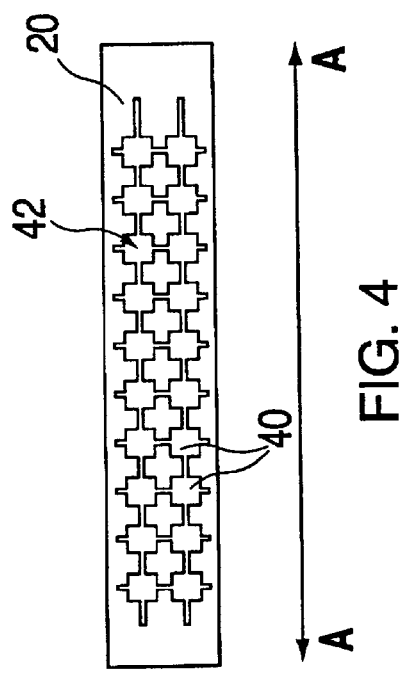
FIG. 4 is a partial bottom view of the backside of the device depicting a lattice pattern of the plurality of metallized vias of FIG. 3.
Figure 5:
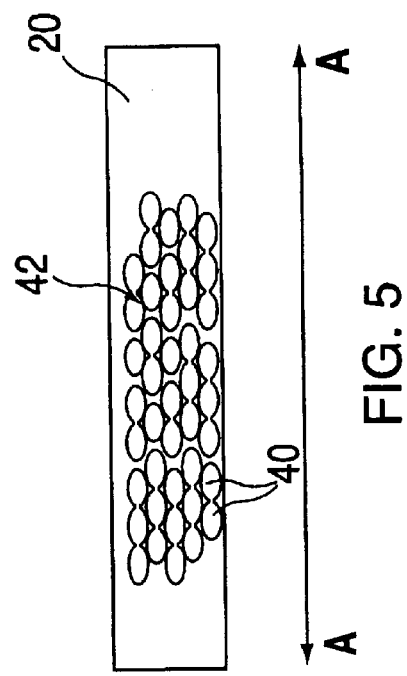
FIG. 5 is a partial bottom view of the backside of the device depicting a honeycomb pattern of the plurality of metallized vias of FIG. 3.
Figure 3:
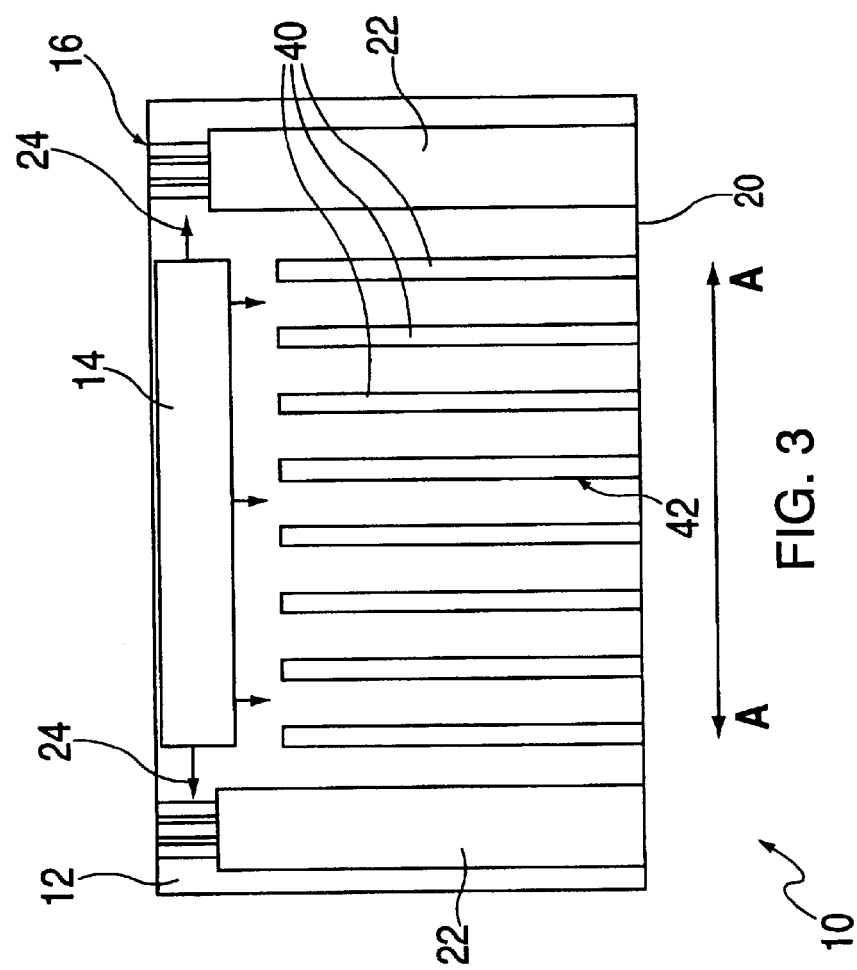
FIG. 3 is a cross section side elevational view of the semiconductor device of FIG. 1 having a plurality of metallized vias disposed proximate an FEOL side of the semiconductor device extending to the backside of the device.

In an exemplary alternative embodiment referring now to FIG. 3, the device 10 of FIG. 1 illustrates a plurality of metallized vias 40 disposed in close proximity to the FEOL side 32 of the semiconductor device 14 for further dissipation of heat from the device 14 and for increased mechanical support of device 10. First, a porous silicon structure is formed in substrate 12 by dry etching methods. Then the vias formed from the dry etch are metallized to form a silicon/copper composite structure 42, as best seen in FIGS. 4 and 5. The embodiment reflected in FIGS. 3–5 is a preferred embodiment over those depicted in FIGS. 1 and 2 because the composite structure 42 offers mechanical strength to the entire packaged device 10.

Referring now to FIGS. 4 and 5, partial oblique views of the backside 20 of two different composite structure 42 patterns are illustrated. More specifically a length A-A of backside 20 in FIG. 3 is illustrated in FIGS. 4 and 5. FIG. 4 depicts a selected lattice pattern while FIG. 5 depicts a selected honeycomb pattern for the plurality of metallized vias 40 forming composite structure 42. It will be appreciated that although lattice and honeycomb patterns are illustrated in FIGS. 4 and 5, respectively, other suitable patterns are contemplated, including symmetrical and non-symmetrical to provide mechanical strength to device 10.

First, a wafer pattern is selected and then etched to form the patterned silicon, also known in the art as a porous silicon structure, not to be confused with the low-K dielectric comprised of silicon containing small voids and also known as "porous silicon". Here, the pattern is transferred into the silicon substrate 12 from backside 20 using a dry etch process. Then, as described above, the vias are metallized, preferably with copper.

In the abovedescribed embodiments illustrated in FIGS. 1–5, process steps are used that are compatible with current back end of line (BEOL) processes used in Damascene processing or currently employed copper technologies. Further, it should be noted that although crack stop 16 is preferably continuous, that the outboard heat sinks or metallized vias 22 extending to the backside 20 of the wafer do not need to be continuous forming a continuous ring around the chip. Because crack stop 16 is continuous, the heat sinks or outboard metallized vias 22 in thermal contact therewith can utilize crack stop 16 for dissipation of generated heat from device 14. In this manner, the above-described embodiments provide for a passive thermal sink for dissipation of heat from the semiconductor devices to the ambient environment.

Figure 6:
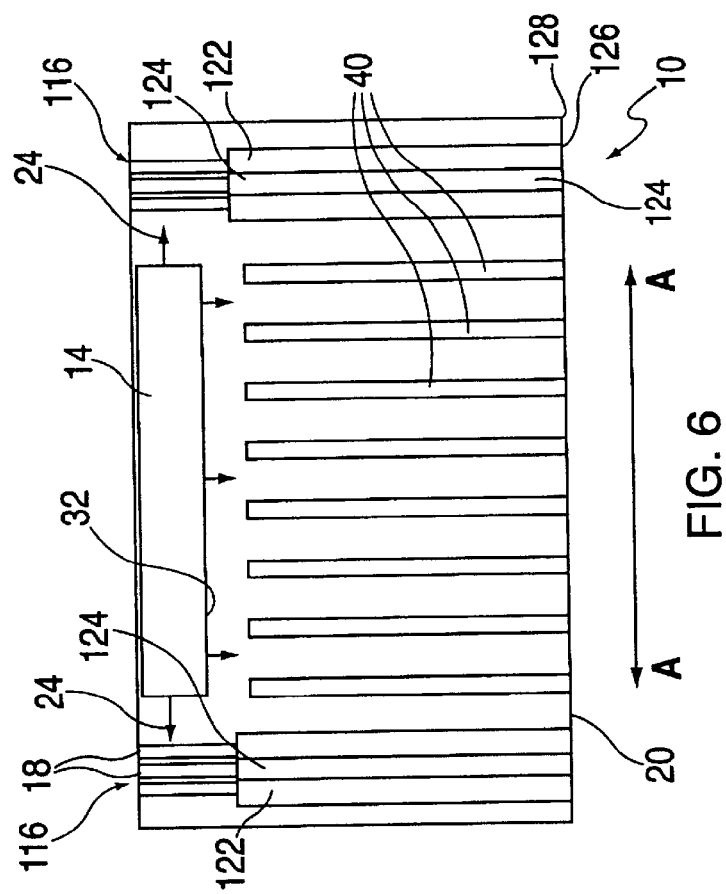
FIG. 6 is a cross section side elevational view of the semiconductor device of FIG. 3 having two outboard metallized annular vias and a plurality of metallized vias disposed proximate an FEOL side of the semiconductor device extending to the backside of the device.

Referring now to FIG. 6, an alternative exemplary embodiment of a self-contained heat sink is illustrated with respect to device 10 illustrated in FIG. 3. A plurality of metallized annular pillar or vias 122 are disposed in thermal contact with crack stop 16 to remove heat from a periphery of the device 14 generally shown with arrows 24. Each metallized annulus surrounds an inner pillar of silicon 124 with the metallized annulus 122 in thermal contact with crack stop 16. The through-metal vias 122 are formed using a deep silicon etch from backside 20, well known in the art. After etching, metallization of each via 122 is with barrier metals and copper, preferably using Damascene processing.

The annular through-vias 122 are produced by patterning the backside 20 of the wafer to yield an annulate silicon surface aligned with the crack stop 116 on the front side. Silicon is removed forming the annulation using a dry etching method to form deep vias surrounding an inner pillar of silicon 124. The annular vias are metallized preferably with copper providing a thermal conduit from the FEOL side of device 14 to backside 20 of the packaged device 10. In this embodiment, heat is drawn away from device 14 to extended crack stops 116 disposed at a periphery and heat is drained through the metal annuli 122 to the backside 20 of the chip or device 10.

It should be noted that the embodiment in FIG. 6 illustrates crack stop 116 that is optionally etched to extend past the active device layer or FEOL side 32, as shown.

Figure 7:
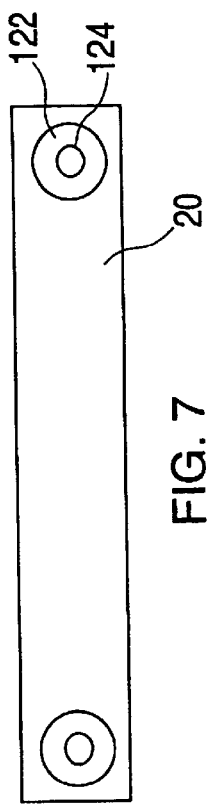
FIG. 7 is a partial bottom view of the backside of the device illustrating the two outboard metallized annular vias.

FIG. 7 is a partial bottom view of backside 20 of FIG. 6 illustrating metal annuli 122 and a corresponding inner pillar of silicon 124 disposed at outboard ends defining backside 20.

Figure 8:
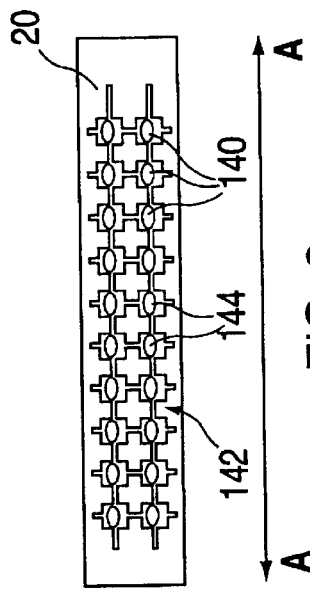
FIG. 8 is a partial bottom view of the backside of the device of FIG. 6 depicting a lattice pattern of the plurality of metallized vias of FIG. 6 being annular.
Figure 9:
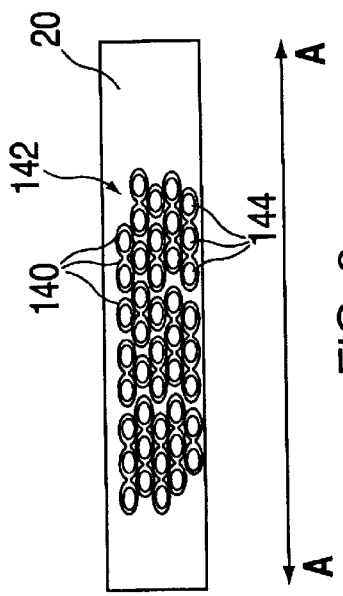
FIG. 9 is a partial bottom view of the backside of the device depicting a honeycomb pattern of the plurality of metallized vias of FIG. 6 being annular.

Referring now to FIGS. 8 and 9, partial oblique views of the backside 20 of two different composite annulate silicon structure 142 patterns are illustrated with respect to alternative embodiments of the plurality of metallized vias 40 disposed in close proximity to the FEOL side 32 of the semiconductor device 14 for further dissipation of heat from the device 14 and for increased mechanical support of device 10. More specifically a length A-A of backside 20 in FIG. 6 is illustrated in FIGS. 8 and 9. FIG. 8 depicts a selected lattice pattern while FIG. 9 depicts a selected honeycomb pattern for a plurality of metallized annular vias 140 forming composite annulate structure 142. It will be appreciated that although lattice and honeycomb patterns are illustrated in FIGS. 8 and 9, respectively, other suitable patterns are contemplated, including symmetrical and non-symmetrical to provide mechanical strength to device 10.

The annular through-vias 140 are produced by patterning the backside of the wafer to yield an annulate silicon surface substantially aligned with the FEOL side 32 of device 14. Silicon is removed forming the annulation using a dry etching method to form annular vias 140 surrounding an inner pillar of silicon 144. The annular vias 140 are metallized preferably with copper providing a thermal conduit from the FEOL side of device 14 to backside 20 of the packaged device 10. In this embodiment, heat is drawn away from device 14 and heat is drained through the metal annuli 140 to the backside 20 of the chip or device 10.

As described above, a wafer pattern is selected and then etched to form the porous silicon structure 142. Here, the pattern is transferred into the silicon substrate 12 from backside 20 using a dry etch process. Then, as described above, the annular vias 140 are metallized, preferably with copper.

Further, as described with vias 22 and 40 in FIG. 3, vias 122 and 40 with respect to FIGS. 6 and 7 and vias 140 with respect to FIGS. 8 and 9 may also include further processing to protect the ends defining a length thereof against exposure to the environment. More specifically, after metallization of each via 122 and 140 with copper, the ends defining a length of each copper via 122 and 140 are preferably protected from the environment with an additional layer. The end 126 includes a metal passivation layer 128 such as Ni or other suitable self-passivation material that provides suitable thermal conduction of the heat indicated with arrows 24 to crack stop 116 and then through a corresponding metallized annular via 122 by the TaN or Ta interface therebetween and also from FEOL side 32 of device 14 through metallized vias 140.

Figure 10:
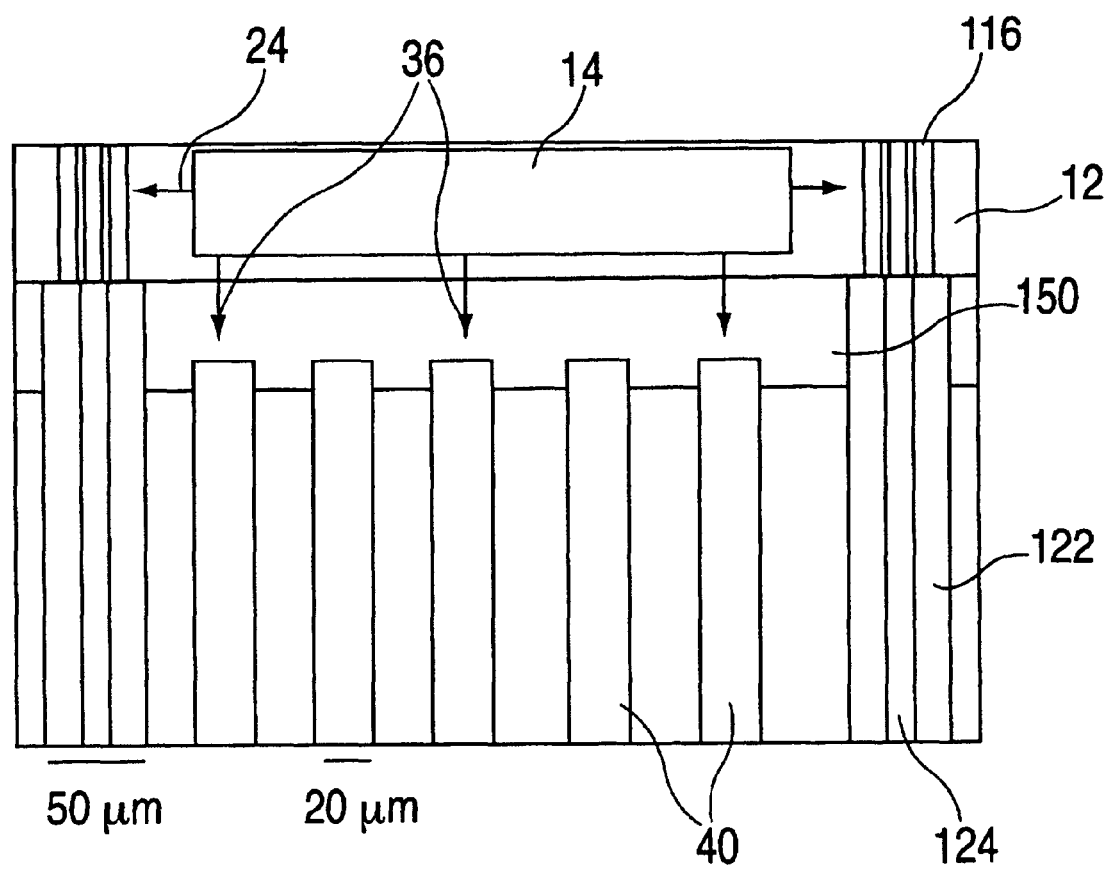
FIG. 10 is a cross section side elevational view of the semiconductor device of FIG. 6 having a doped Si layer disposed proximate an FEOL side of the semiconductor device in communication with the plurality of metallized vias disposed proximate an FEOL side of the semiconductor device.

FIG. 10 is an alternative embodiment with respect to that described and shown in FIG. 6. More specifically, outboard annular, through-via drains 122 are disposed for extracting excess heat from semiconductor device 14. It should be noted that the annular structure of vias 122 improves thermal and mechanical stability while providing a short, thermal path for heat to be dissipated from the semiconductor devices. As discussed above, a metallized annulus surrounds an inner pillar of silicon 124 with the metallized annulus as a thermal contact to crack stop 116 to remove heat at the periphery. An array of metallized vias 40 (shown) or metallized annuli 140 (FIGS. 8 and 9) are disposed in the silicon substrate 12 for radial dissipation of heat from the device and for mechanical support.

The array of metallized annuli 122 and metallized vias 40 or metallized annuli 140 of different sizes and depths are produced in a single deep etch process step for radial dissipation of heat and mechanical support of device 10. For example, as shown in FIG. 10, the metallized vias 40 proximate a center of the chip and intermediate metallized annuli 122 are shallower than the annuli 122 edge structures. The metallized vias 40 contact a highly doped silicon region 150 (as shown in FIG. 10) to prevent damage to the FEOL device 14 during backside processing.

Fabrication of the embodiment shown in FIG. 10 includes thinning the wafer to about 200 $\mu$m where a portion thereof is heavily doped to enhance thermal conductivity. This creates a large, thermal sink or region 150 directly under the buried, insulating SiOx. A dry etching method, such as a deep RIE process, for example, is used to create deep silicon vias 40 and 122 from the backside 20 of the wafer. The vias 122 at the periphery of the chip contact the metallized crack stop 116. The vias 40 proximate a center of the chip contact the heavily doped silicon region 150 directly below device 14. Damascene processing or other suitable metallization technology is used to metallize vias 40, 122.

The depth of the vias is precisely controlled during the deep RIE process as to avoid damaging the semiconductor device 14. This disclosure exploits the etch phenomenon known as "RIE lag", where a variation in etch depth is controlled via variation in etch width. For example, for a timed etch, larger vias 122 (e.g., 50 µm diameter) will be etched to a greater depth than smaller vias 40 (e.g., 20 µm diameter). Hence, RIE lag is used to produce vias deeper at the periphery of the chip (i.e., those contacting the metallized crack stop 116) than the center of the chip (i.e., those contacting the heavily doped region 150) in a single processing step.

The backside of the wafer is patterned with vias of varying size and, as a result of RIE lag, the larger vias 122 at the periphery of the chip are etched to contact the metallized crack stop 116 while the smaller vias 40 concentrated at the center of the chip are etched to a shallow depth to avoid damaging the semiconductor device 14. Heat depicted with arrows 24 and 36 is dissipated radially through the different-sized thermal vias 40, 122 to the backside 20 of the chip. Depending on the depth of the extended crack stop 116, RIE lag can be exploited to produce deep silicon structures of varying depths or the backside patterning may include vias of uniform diameter that are etched to the same depths.

High power semiconductor devices generate a large amount of heat during operation that must be removed to maintain device performance and to prevent damage to semiconductor devices. This problem may be exasperated in advanced multichip packaging, where a few chips are mounted on a small carrier for a higher wiring density than a traditional multichip module. Such a "system on a package" is shown at 200 in FIG. 11 where chips 114 of different technologies are flip-chip bonded wall-to-wall on a self-supporting silicon carrier module or substrate 112. In this scheme, excess heat generated during operation of a high power chip may cause internal damage as well as damage to other chips on the module via thermal transfer. Furthermore, replacement of individual chiplets or the entire module would be difficult and costly. Hence, it is important to provide a thermal path through the substrate 112 to remove excess heat and to prevent damage to the chips in the module.

Figure 11:
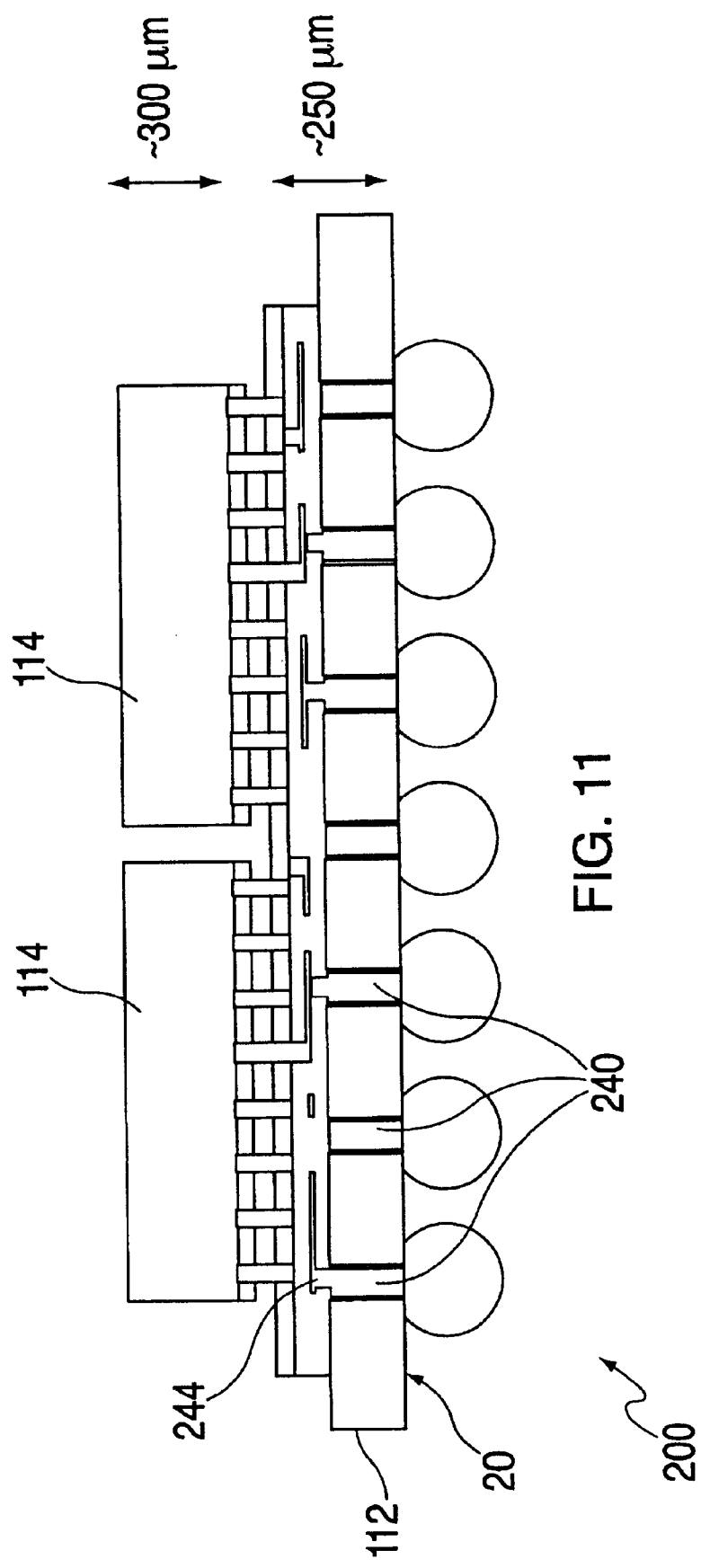
FIG. 11 is a cross section side elevational view of a carrier module having a plurality of metallized vias extending therethrough in thermal communication with two heat producing chips mounted thereto.

Thus, this disclosure further includes fabrication of thermal conduits integrated in the chip and metallized through-vias shown generally at 240 in the substrate 112 for thermal conduction from the semiconductor devices or chips 114 through the passive carrier module 112. In this manner, a short thermal conductive path is produced where the distance between the heat source (e.g., chips 114) and sink (e.g., backside 20 of substrate 112 exposed to ambient environment) is less than about 550 µm or the combined thickness of the individual chips 114 and substrate 112. As illustrated in FIG. 11, substrate is about 250 µm while chips 114 are about 300 µm in thickness.

The embodiment illustrated in FIG. 11 shows thermal conduits fabricated within the chip structure as opposed to depending therefrom. The electrical connection from the chips 114 to the carrier 112 is via a series of metal wiring levels 244 on a topside of the carrier 112. Metallized through vias 240 contact the metal wiring levels 244. The metallized through vias 240 are fabricated by first using a dry etching method to produce vias in excess of 200 µm deep, then copper metallization or metal composite paste is employed to produce metallized, deep vias. Next, backside grinding thins the wafer and exposes the metallized through-vias 240 to the ambient environment. Hence, the topside wiring levels 244 and metallized through-vias 240 provide a continuous thermal path through the carrier 112. With the thermal conduits integrated in the individual chips, the passive carrier provides a thermal conduction path from the semiconductor devices 114 to the backside 20 of the carrier 112.

The above described embodiments allow using process steps that are compatible with current FEOL processes and BEOL processes used in current copper technologies e.g., Damascene processing. The above described system and method provide a self-contained passive thermal sink for dissipation of heat from semiconductor devices to the ambient environment. The passive thermal sink is configured to provide thermal transfer through the FEOL side of the semiconductor device to a backside of a substrate to which the FEOL device is disposed. An exemplary embodiment provides adequate thermal transfer from all areas of active device layers.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A system for thermal dissipation from a heat producing electronic device comprising:

a substrate for fabricating integrated circuits, said substrate having a first face and a second face, said second face being disposed substantially parallel to said first face;

an electronic device disposed in said first face;

a crack stop disposed in said first face surrounding said electronic device, said crack stop being metallized; and a plurality of first metal conduits extending through said substrate from said second face thereof to said crack stop, wherein each first metal conduit is in thermal contact with said crack stop.

2. The system of claim 1 wherein said crack stop is continuous.

3. The system of claim 1 wherein a portion of said substrate from said second face extending toward and substantially aligned with said electronic device is configured for removal and disposing a planar heat sink therein proximately facing a backside defining said electronic device.

4. The system of claim 3 wherein said planar heat sink is a metallized layer configured to dissipate heat from said backside defining said electronic device.

5. The system of claim 1 further comprising:

a plurality of second metal conduits, wherein each second metal conduit of said plurality of second metal conduits extends through said substrate from said second face thereof toward said electronic device but short thereof.

6. The system of claim 1 wherein said each second metal conduit extends to a doped layer disposed in said substrate between said electronic device and said second face, said doped layer configured to control extension of said each second metal conduit toward said electronic device during fabrication.

7. The system of claim 5 wherein said plurality of second metal conduits is positioned to be substantially equidistant from each other conduit of said plurality of second metal conduits.

8. The system of claim 7 wherein a pattern formed by said plurality of second metal conduits is variable over an area of said substrate.

9. The system of claim 1 wherein each conduit of said plurality of first and second metal conduits is fabricated from copper.

10. The system of claim 1 wherein each conduit of at least one of said plurality of first and second metal conduits is a metal annular conduit.

11. The system of claim 1 wherein each said metal annular conduit defines a cylinder surrounding one of air and said substrate.

12. The system of claim 1 wherein said crack stop is configured to extend past the BEOL to the FEOL of said electronic device disposed in said substrate.

13. The system of claim 1 wherein said substrate is a carrier module and said electronic device includes at least one chip disposed on said carrier module.

* * * * *